(12) United States Patent
Hasan

(10) Patent No.: US 9,035,642 B2
(45) Date of Patent: May 19, 2015

(54) CIRCUITS FOR DETECTING AC- OR DC-COUPLED LOADS

(75) Inventor: Mahbub Hasan, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 867 days.

(21) Appl. No.: 13/173,375

(22) Filed: Jun. 30, 2011

(65) Prior Publication Data

US 2013/0002233 A1    Jan. 3, 2013

(51) Int. Cl.
*G01R 27/14* (2006.01)
*G01R 31/28* (2006.01)

(52) U.S. Cl.
CPC ............ *G01R 27/14* (2013.01); *G01R 31/2843* (2013.01)

(58) Field of Classification Search
CPC .............. G01R 25/00; G01R 31/3004; G01R 31/2843; G01R 27/14; H02M 3/156; H02M 2001/0019; G05F 1/10
USPC ...................................................... 324/76.77
See application file for complete search history.

(56) References Cited

U.S. PATENT DOCUMENTS

| | | | |
|---|---|---|---|
| 2,961,605 A | 11/1960 | Broadhead, Jr. | |
| 4,010,402 A | 3/1977 | Miyata | |
| 4,661,717 A | 4/1987 | Nishioka | |
| 5,510,950 A | 4/1996 | Bills et al. | |
| 5,825,321 A | 10/1998 | Park | |
| 5,920,452 A | 7/1999 | Sullivan | |
| 6,150,823 A | 11/2000 | Takahashi et al. | |
| 6,278,390 B1 | 8/2001 | Meyer et al. | |
| 6,411,330 B1 | 6/2002 | Purcell et al. | |
| 6,812,715 B2 | 11/2004 | Chiozzi et al. | |
| 6,940,440 B1 | 9/2005 | Iacob | |
| 7,224,142 B2 | 5/2007 | Asaumi et al. | |
| 7,259,618 B2 | 8/2007 | Hand et al. | |
| 7,515,208 B1 | 4/2009 | Young et al. | |
| 7,633,560 B1 | 12/2009 | Sivertsen | |
| 7,675,544 B2 | 3/2010 | Koo et al. | |
| 7,719,251 B2 | 5/2010 | Qahouq et al. | |
| 7,898,601 B1 | 3/2011 | Sivertsen | |
| 2002/0093340 A1 | 7/2002 | Chiozzi et al. | |
| 2003/0122549 A1 | 7/2003 | Chiozzi et al. | |

(Continued)

FOREIGN PATENT DOCUMENTS

| | | |
|---|---|---|
| EP | 1118865 A1 | 7/2001 |
| EP | 1150279 B1 | 9/2008 |

(Continued)

*Primary Examiner* — Tung X Nguyen
*Assistant Examiner* — Son Le
(74) *Attorney, Agent, or Firm* — Polansky & Associates, P.L.L.C.; Paul J. Polansky

(57) ABSTRACT

An integrated circuit includes an output terminal and a controller having a measurement input coupled to the output terminal, a first output adapted to couple to a current source to control a first current sourced into the output terminal, and a second output adapted to couple to a current sink to control a second current from the output terminal. The controller applies control signals to the first output and the second output to selectively enable the current source and disable the current sink during a first phase of a load detection period and to disable the current source and enable the current sink during a second phase of the load detection period. The controller detects the load coupled to the output terminal if a voltage at the measurement terminal during the first phase is substantially equal to a voltage at the measurement terminal during the second phase.

20 Claims, 4 Drawing Sheets

(56) References Cited

U.S. PATENT DOCUMENTS

| | | |
|---|---|---|
| 2005/0024013 A1 | 2/2005 | Asaumi et al. |
| 2006/0280436 A1 | 12/2006 | Koo et al. |
| 2007/0057720 A1 | 3/2007 | Hand et al. |
| 2007/0273388 A1 | 11/2007 | Tang |
| 2009/0040791 A1 | 2/2009 | Qahouq et al. |
| 2009/0322426 A1 | 12/2009 | Nyboe et al. |
| 2010/0019781 A1 | 1/2010 | Woelfl et al. |
| 2010/0073485 A1 | 3/2010 | Koo et al. |
| 2011/0095741 A1* | 4/2011 | Huang et al. .......... 323/283 |

FOREIGN PATENT DOCUMENTS

| | | |
|---|---|---|
| EP | 2114091 A1 | 11/2009 |
| EP | 2120485 A1 | 11/2009 |

* cited by examiner

CIRCUITS FOR DETECTING AC- OR DC-COUPLED LOADS

FIELD

The present disclosure is generally related to load detection circuitry, and more particularly to circuits and methods of detecting AC and DC-coupled loads.

BACKGROUND

In low power devices, such as battery powered devices and electronic devices designed to satisfy energy efficiency criteria, power consumption is tightly controlled. In electronic devices that include video amplifiers for driving televisions or computer monitors, the video amplifiers often consume power even when a monitor or television is not connected to the amplifier output. However, different manufacturers use different types of connections. Accordingly, when a load is connected, it may not be known ahead of time whether the load is AC-coupled or DC-coupled. If it were possible to detect the presence or absence of the load regardless of the type of load, the device could better save power.

DETAILED DESCRIPTION OF ILLUSTRATIVE EMBODIMENTS

Embodiments of circuits and methods are described below that include circuitry for detecting a load connected to an output terminal, whether the load is AC-coupled or DC-coupled. In particular, the load may be of an unknown type, either AC-coupled or DC-coupled. In an embodiment, the circuit includes an output terminal configurable to couple to a load circuit via an AC or DC coupling and a driver circuit connected to the output terminal. The circuit further includes at least one current source for sourcing current to the output terminal during a first phase and for sinking current from the output terminal during a second phase. The circuit also includes a controller for determining a first voltage on the output terminal during the first phase and a second voltage on the output terminal during the second phase. The controller detects a load connected to the output terminal when the first and second voltages are substantially the same and detects that there is no load connected to the output terminal when the first and second voltages are not substantially the same. In an embodiment, the controller generates a control signal for enabling a driver circuit connected to the output terminal when the first and second voltages are substantially the same and for disabling the driver circuit when the first and second voltages are different.

By selectively disabling the driver circuit, such as a power amplifier, when no load is connected to the output terminal, power savings can be realized. However, detection of a display device, for example, can be complicated by the absence of industry standards for achieving the connection. Some display devices may be direct current (DC) coupled to the driver circuit, while others may be alternating current (AC) coupled. Embodiments of the circuit are configured to detect a load connected to the output terminal regardless of whether the load is AC- or DC-coupled. In particular, the circuit sources and sinks current to and from the output terminal and measures the voltages to detect the load. If a load is connected to the output terminal, the measured voltages will remain substantially unchanged. If the load is not connected to the terminal, the measured voltages vary, and the controller can disable the driver circuit (such as a video amplifier) in response to detecting the variation in the voltages to reduce overall power consumption of the system. An example of a circuit for detecting an AC-coupled load is described below with respect to FIG. 1.

Figure 1:
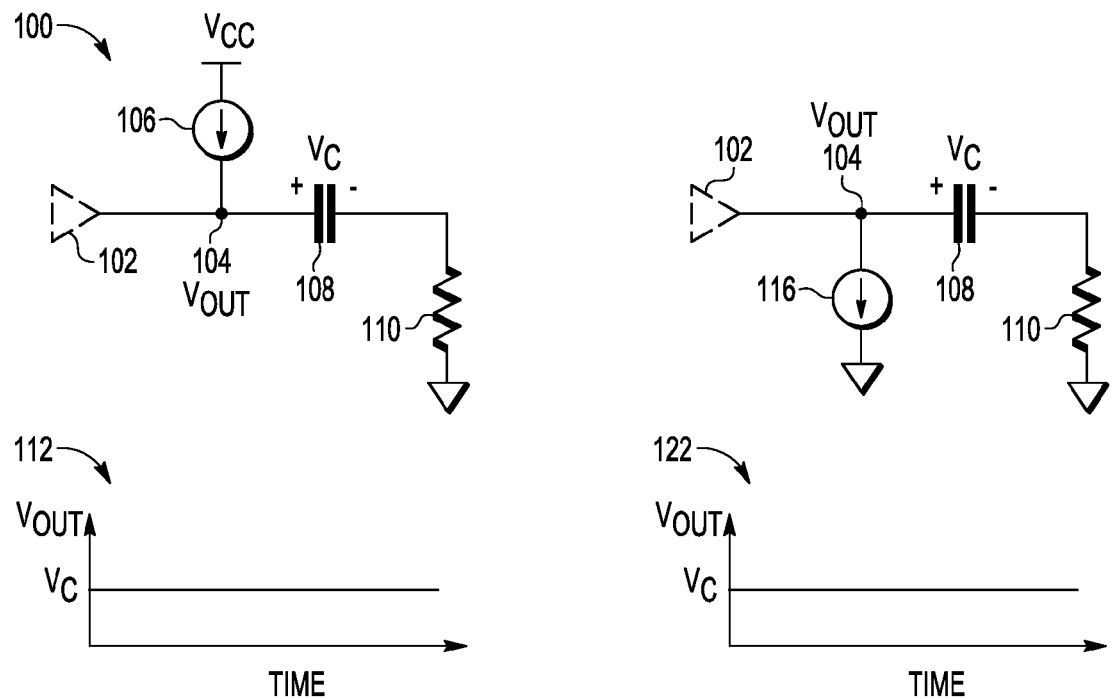
FIG. 1 is a diagram including partial circuit diagrams and associated output signal diagrams of a circuit for detecting an AC-coupled load.

FIG. 1 is a diagram including partial circuit diagrams and associated output signal diagrams of a circuit 100 for detecting an AC-coupled load. Circuit 100 includes a driver circuit 102, such as an amplifier, that includes an input for receiving a signal and an output for providing an amplified version of the signal to an output terminal 104. Circuit 100 further includes a current source 106 for sourcing current to output terminal 104. Output terminal 104 is connected to a first electrode of a capacitor 108, which has a second electrode connected to a load, which is represented by resistor 110.

During a first phase, circuit 100 enables current source 106 to source a relatively small current to the output terminal 104. In this instance, load 110 is AC-coupled through capacitor 108 to output terminal 104. A voltage at output terminal 104 is approximately equal to an initial voltage (Vc) across capacitor 108, assuming the voltage drop across the load 110 caused by the small current is negligible. As illustrated by graph 112, the output voltage at output terminal 104 is at a level corresponding to the initial voltage (Vc) across capacitor 108.

Circuit 100 further includes a current sink 116 configured to sink current from output terminal 104. During the second phase, circuit 100 enables current sink 116 to sink a relatively small current from output terminal 104. In this instance, the load 110 is still AC-coupled to output terminal 104. A voltage at output terminal 104 is approximately equal to the initial voltage (Vc) across capacitor 108 (as shown by graph 122), assuming the voltage change across the load 110 caused by the small current remains negligible.

In the illustrated example, it is assumed that the length of the first phase during which the current is sourced onto output terminal 104 is small enough compared to the charging time of capacitor 108 that the initial voltage (Vc) does not change noticeably. During the second phase, the small current that is drawn from the output terminal and the length of time of the second phase is small enough that the initial voltage (Vc) remains substantially the unchanged. Thus, a controller connected to the output terminal 104 can detect load 110 connected to the output terminal 104 when the first voltage and the second voltage remain substantially the same during the first phase and the second phase. An example of the circuit 100 of FIG. 1 having a missing AC-coupled load is described below with respect to FIG. 2.

Figure 2:
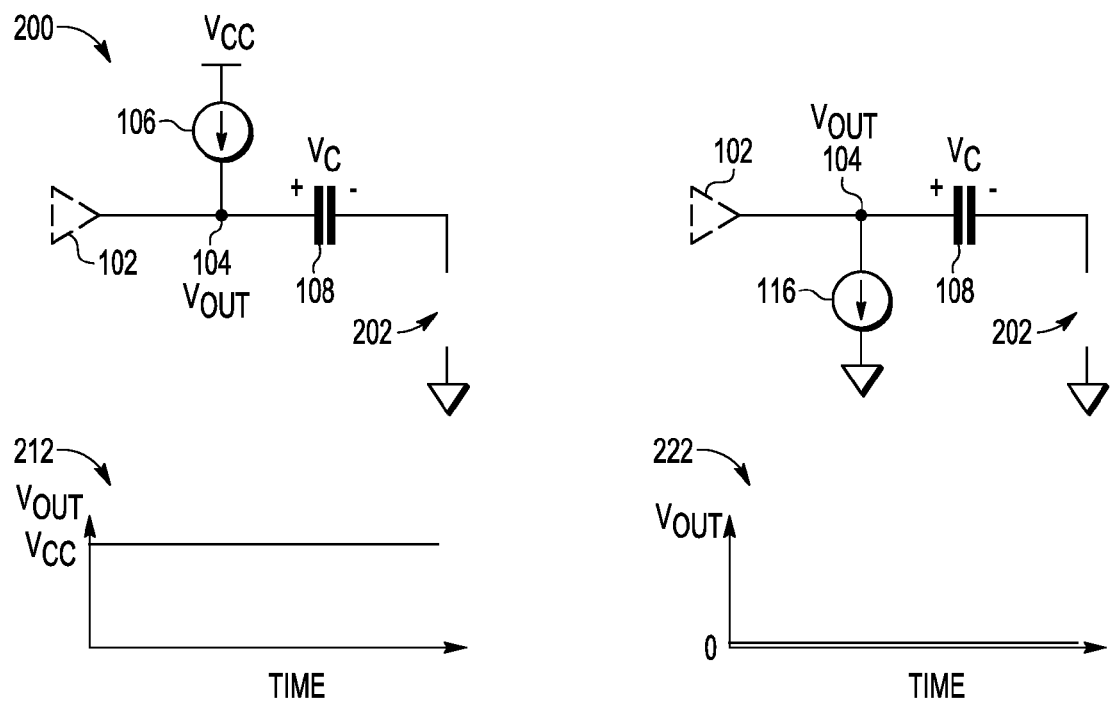
FIG. 2 is a diagram including partial circuit diagrams and associated output signal diagrams of the circuit of FIG. 1 for detecting the absence of the AC-coupled load.

FIG. 2 is a diagram 200 including partial circuit diagrams and associated output signal diagrams of the circuit 100 of FIG. 1 for detecting the absence of the AC-coupled load. In diagram 200, load 110 is replaced by an open circuit generally indicated at 202.

As shown in graph 212, when current source 106 attempts to source a constant current to output terminal 104 and no load 110 is present, the output voltage (Vout) on the output terminal 104 is pulled up to the supply voltage level (Vcc) during the first phase. During the second phase when the current sink 116 sinks current, the output voltage (Vout) on output terminal 104 is pulled down to a second power supply level, such as ground (as depicted in graph 222). Thus, the measured voltage at output terminal 104 varies substantially between the first phase and the second phase when there is no load 110. An example of a technique for measuring a DC-coupled load is described below with respect to FIG. 3.

Figure 3:
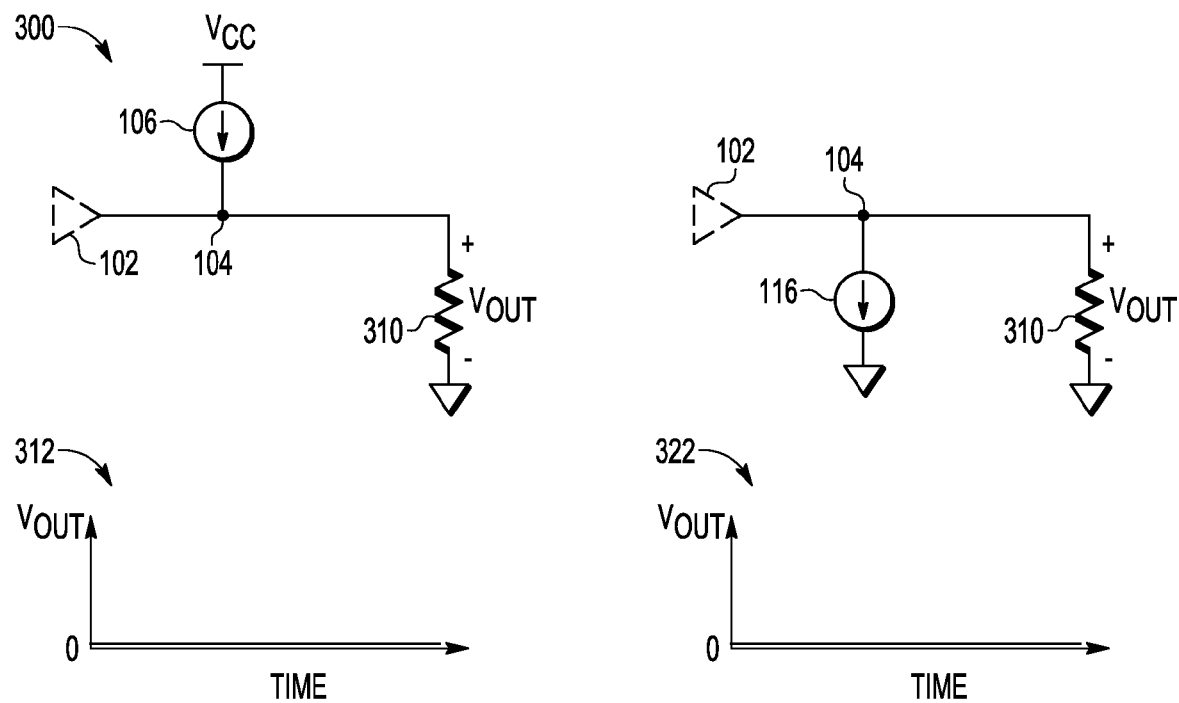
FIG. 3 is a diagram including partial circuit diagrams and associated output signal diagrams of a circuit for detecting a DC-coupled load.

FIG. 3 is a diagram including partial circuit diagrams and associated output signal diagrams of a circuit 300 for detecting an AC-coupled load. In this example, the circuit 300 is substantially the same as circuit 100, except that capacitor 108 is omitted and the load 110 is replaced by a load 310. In general, load 310 may differ in some way from the load 110, allowing load 310 to be DC-coupled to output terminal 104.

As depicted in graphs 312, when current source 106 sources current onto output terminal 104, the output voltage on output terminal 104 is approximately zero during the first phase. During the second phase as shown in graph 322, when the current sink 116 sinks current from output terminal 104, the output voltage remains at approximately zero. While the graphs 312 and 322 depict the output voltage to be approximately zero volts, it should be understood that the voltage level may be negative or at some other voltage level between ground and the supply voltage (Vcc), depending the load 310 connected to the output terminal 104. However, when the load 310 is connected to output terminal 104, the output voltage remains substantially the same during the first phase and the second phase. However, if the load 310 is removed leaving an open circuit, the output voltage changes from supply rail to supply rail (such as from Vcc to ground) as described below with respect to FIG. 4.

Figure 4:
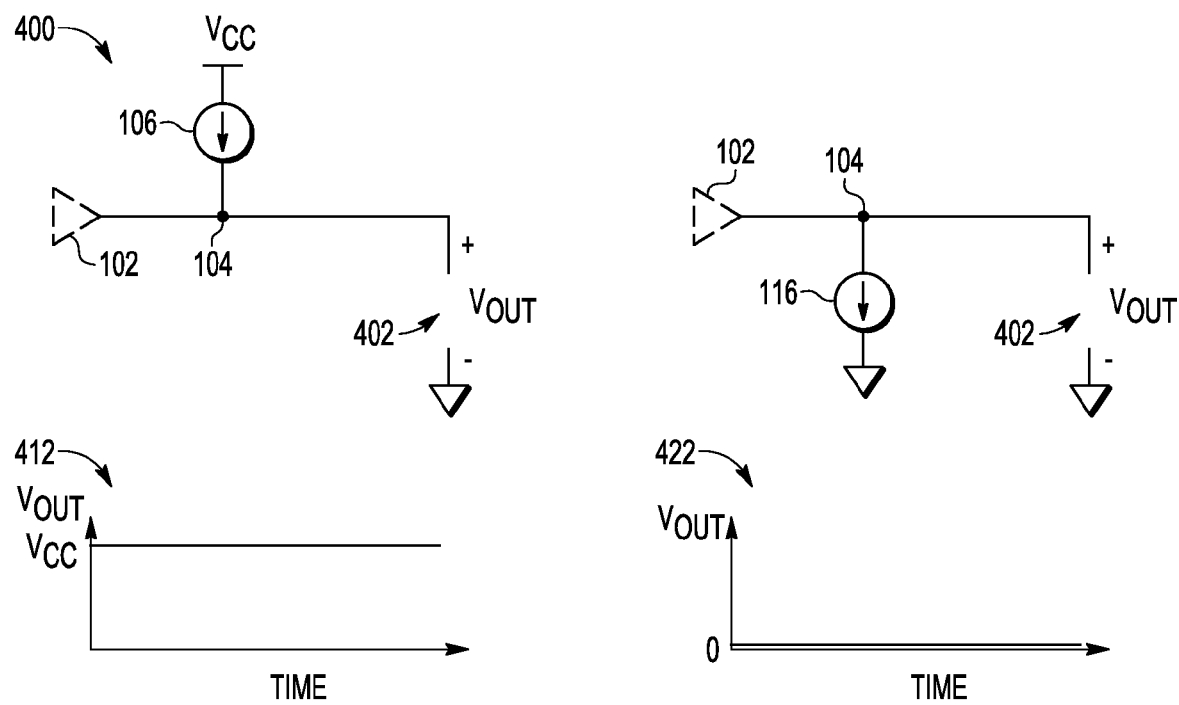
FIG. 4 is a diagram including partial circuit diagrams and associated output signal diagrams of the circuit of FIG. 3 for detecting the absence of the DC-coupled load.

FIG. 4 is a diagram 400 including partial circuit diagrams and associated output signal diagrams of the circuit 300 of FIG. 3 for detecting an AC-coupled load for detecting the absence of the DC-coupled load. The absent load is represented by an open circuit, generally indicated at 402. During the first phase represented by graph 412, when current source 106 sources current onto output terminal 104, the output voltage increases up to the supply voltage level (Vcc). During the second phase represented by graph 422, when current sink 116 sinks current from output terminal 104, the output voltage decreases to a relatively low level, such as ground.

By using small currents, the sourcing and sinking of currents onto the output terminal produces a substantial change in the output voltage when a load is not connected to the output terminal 104 and produces substantially no change when the load is connected to output terminal 104. As described with respect to FIGS. 1-4, the presence or absence of the load is detectable whether the load is AC-coupled or DC-coupled to output terminal 104. An example of a circuit configured to detect the presence/absence of the load and to selectively enable/disable an output driver circuit in response to the detection is described below with respect to FIG. 5.

Figure 5:
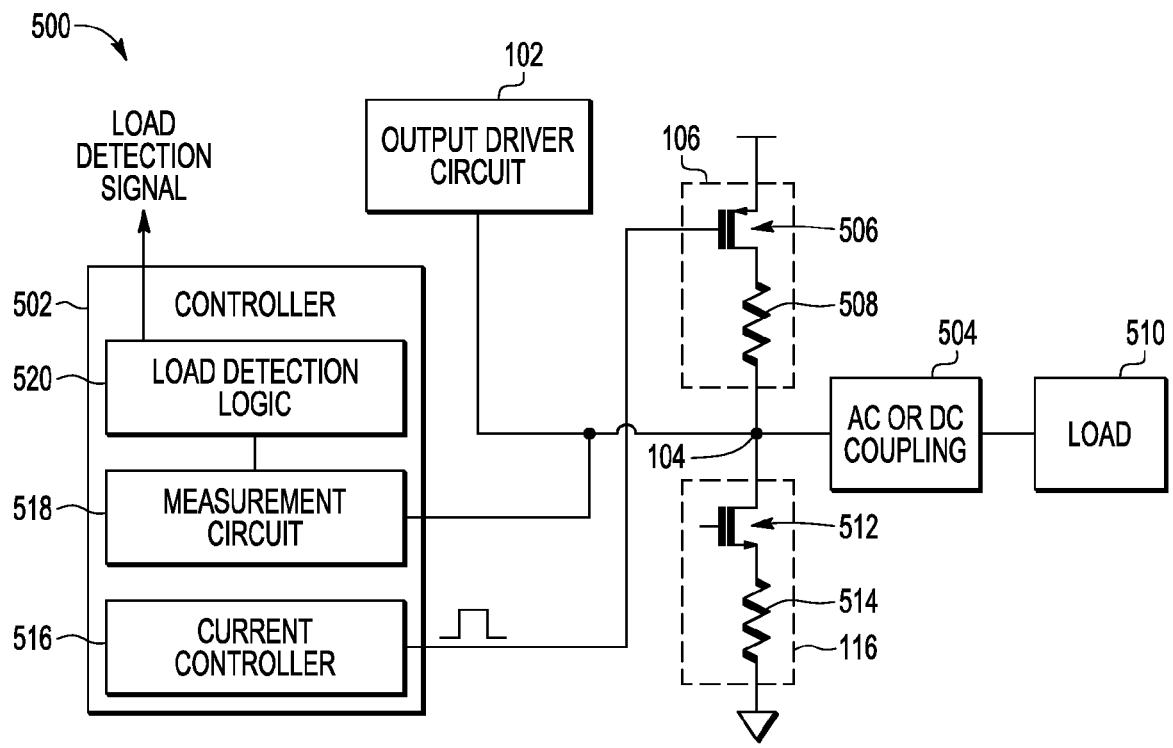
FIG. 5 is a partial block diagram and partial circuit diagram of a circuit for detecting a load of an unknown type (AC-coupled or DC-coupled).

FIG. 5 is a partial block diagram and partial circuit diagram of a circuit 500 for detecting a load of an unknown type (AC-coupled or DC-coupled). Load 510 may be AC-coupled or DC-coupled as indicated by the AC or DC coupling block 504. In some instances, the AC or DC coupling block 504 may be part of an interface associated with the load 510. Circuit 500 includes an output driver circuit 102 including an output connected to output terminal 104. Circuit 500 further includes a current source 106 and a current sink 116, which are connected to output terminal 104. Further, circuit 500 includes a controller 502 including a measurement input connected to output terminal 104 and a first output connected to current source 106 and a second output connected to current sink 116 to control the sourcing and sinking of current onto and from output terminal 104. Controller 502 further includes a third output for providing a load detection signal, a driver control signal, or other output signal, which may be used to selectively enable output driver circuit 102 when the load 510 is detected and to selectively disable the output driver circuit 102 when the load 510 is not detected.

Current source 106 includes a p-channel metal oxide semiconductor (PMOS) transistor including a source connected to a power supply terminal (such as a positive supply rail (Vcc)), a gate connected to the controller 502, and a drain connected a first terminal of a resistor 508, which has a second terminal connected to output terminal 104. Current sink 116 includes an n-channel MOS (NMOS) transistor including a drain connected to output terminal 104, a gate connected to the controller 502, and a source connected to a first terminal of a resistor 514, which has a second terminal connected to a second power supply terminal, such as ground.

Controller 502 includes a current controller 516 connected to the gates of PMOS transistor 506 and NMOS transistor 512 to selectively control current source 106 and current sink 116 to source and sink current, respectively. Controller 502 further includes a measurement circuit 518 to measure a first voltage from output terminal 104 and a second voltage from output terminal 104. Load detection logic 520 detects the absence of load 510 when the first and second voltages differ and to generate a load detection signal indicating the presence of load 510 when the first and second voltages are substantially the same. In some instances, controller 502 provides the load detection signal to output driver circuit 102 to selectively enable the output driver circuit 102 to drive signals to the load 510 via the output terminal 104.

In an example, controller 502 utilizes current controller 516 to control current source 106 to source current to output terminal 104. In particular, current controller 516 enables current flow through transistor 506 by applying a bias signal to the control terminal of transistor 506. The current flows through transistor 506 and across resistor 508 to output terminal 104. Thus, current source 106 is selectively enabled to source current across resistor 508 and to output terminal 104. While current source 106 is sourcing current into output terminal 104 (during a first phase), controller 502 measures a first voltage on output terminal 104. Controller 502 then disables current flow through transistor 506 and activates current sink 116 to sink a second current from output terminal 104. In particular, controller 502 applies a signal to the control terminal of transistor 512 of current sink 116, which conducts current from output terminal 104 through resistor 514 to the second power supply terminal, such as ground. Thus, current sink 116 is selectively enabled to sink current from output terminal 104. While controlling the current sink 116 to sink the current, controller 502 measures a second voltage at output terminal 104. Controller 502 uses measurement circuit 518 to capture the first and second voltages.

Controller 502 uses load detection logic 520 to determine whether load 510 is connected to the output terminal 104, whether the load is AC-coupled or DC-coupled, based on the first and second voltages.

In an example, load detection logic 520 generates a load detection signal, which can be provided to other circuits. In a particular example, the load detection signal or some other enabling signal may be provided to output driver circuit 102 to selectively enable or disable the output driver circuit 102. When no load is detected, load detection logic 520 may generate a disable signal to disable output driver circuit 102. In contrast, when load detection logic 120 detects load 510 based on the first and second voltages, load detection logic 120 can generate an enable signal to turn on output driver circuit 102.

In the illustrated example, the current controller 516 generates a pulse, such as a square wave, for controlling the current source 106 and current sink 116. In this example, the current source 106 and current sink 116 are biased to conduct current at different times. In an embodiment, current controller 516 may be configured to provide separate bias signals for controlling current source 106 and current sink 116, independently.

Further, it should be appreciated upon review of FIGS. 1-4 that an AC-coupled load exhibits a different voltage response as compared to the DC-coupled load. In some instances, load detection logic 520 may be configured to identify the type of connection and may generate a load detection signal that includes information identifying the type of connection. Output driver circuit 102 may adjust its operating mode in response to determining the type of coupling (i.e., AC-coupled or DC-coupled). In an example, output driver circuit 102 may utilize a different communication protocol enhanced power efficiency for a DC-coupled load as compared to that used with an AC-coupled load in response to receiving the load detection signal. In another example, output driver circuit 102 may utilize a higher frequency when communicating with an AC-coupled load as compared to a DC-coupled load.

Figure 6:
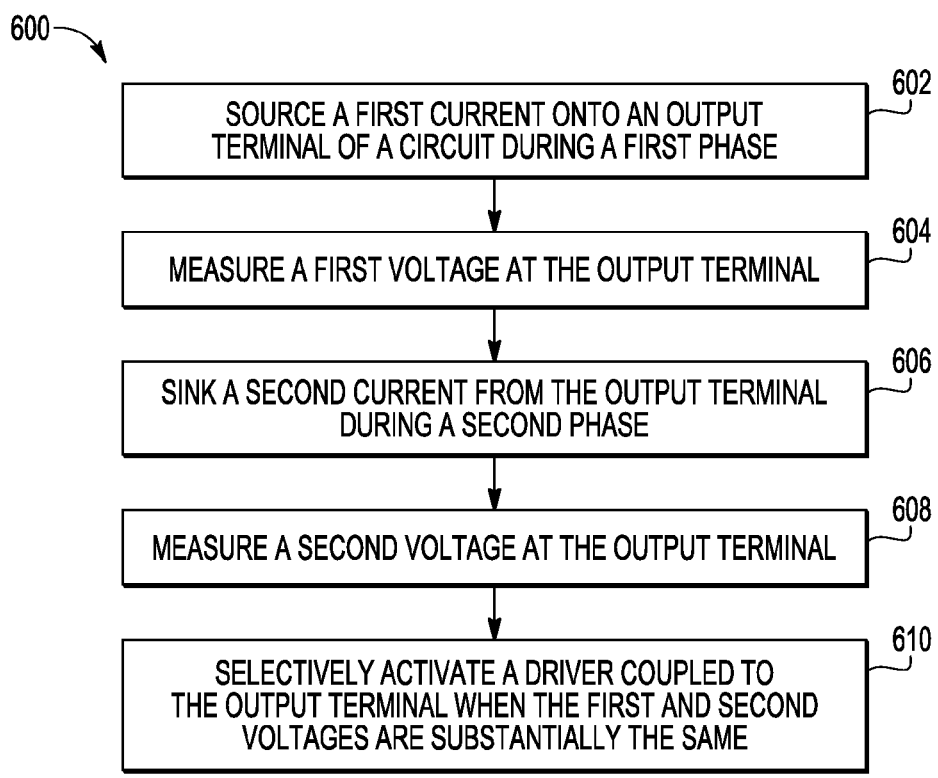
FIG. 6 is a flow diagram of a method for detecting an AC- or DC-coupled load.

FIG. 6 is a flow diagram of a method 600 for detecting an AC- or DC-coupled load. At 602, a first current is sourced onto an output terminal of a circuit during a first phase. In an example, a controller controls a current source to source current onto the output terminal after disabling an output driver circuit. Advancing to 604, the controller measures a first voltage at the output terminal. Continuing to 606, the controller controls a current sink to sink a second current from the output terminal during a second phase. For example, the controller disables the current source and then activates the current sink. Proceeding to 608, the controller measures a second voltage at the output terminal. Moving to 610, the controller selectively activates a driver connected to the output terminal when the first and second voltages are substantially the same.

Figure 7:
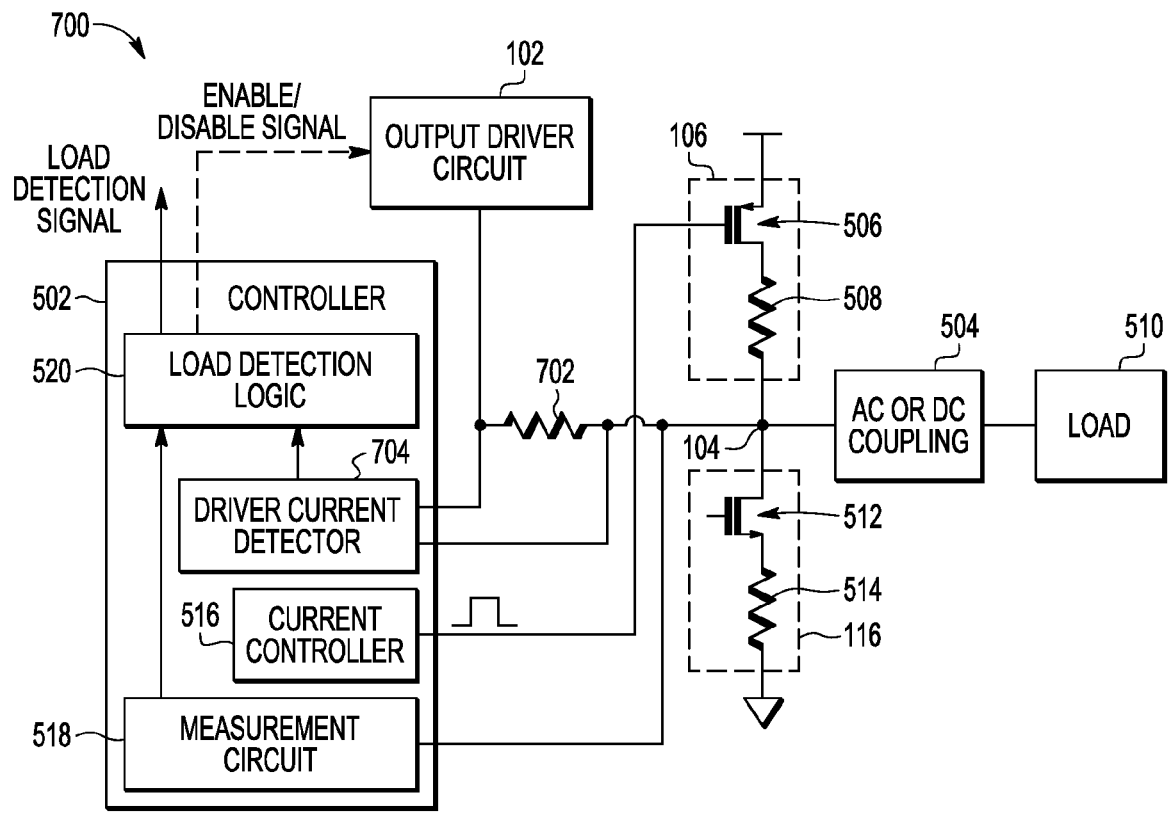
FIG. 7 is a partial block diagram and partial circuit diagram of a second embodiment of a circuit for detecting an AC-coupled or DC-coupled load.

FIG. 7 is a partial block diagram and partial circuit diagram of a second embodiment of a circuit 700 for detecting an AC- or DC-coupled load. The circuit 700 includes all of the elements of circuit 500 and includes a sense resistor 702 and driver current detection logic 704. Sense resistor 702 includes a first terminal connected to an output of output driver circuit 102 and a second terminal connected to output terminal 104. Driver current detector 704 includes a first input connected to the first terminal of sense resistor 702 and a second input connected to the second terminal of sense resistor 702. A differential voltage across sense resistor 702 indicates that output driver circuit 102 is driving current onto output terminal 104. Driver current detector 704 detects the voltage difference and communicates the difference to load detection logic 520. In a particular example, controller 502 may compare the differential voltage across sense resistor 702 to a threshold current level and may detect the absence of the load 510 when the differential voltage is less than or equal to the threshold current level.

In an example, if the load 510 is disconnected from output terminal 104, the driver current will stop flowing across sense resistor 702. In this instance, driver current detector 704 detects a decrease in current across resistor 702 and communicates data to load detection logic 520 indicating that the load 510 may have been disconnected. In an example, the reduction in current can be detected as a change in the voltage across resistor 702.

In response to the signal from driver current detector 704, load detection logic 520 disables output driver circuit 102 and initiates a load detection operation. During the load detection operation, controller 502 selectively enables the current source 106 to source current onto output terminal 104 and uses measurement circuit 518 to measure a first voltage on output terminal 104. Controller 502 then disables the current source 106 and enables current sink 116 to sink current from output terminal 104 and uses measurement circuit 518 to measure a second voltage on output terminal 104. If the first and second voltages are substantially the same, controller 502 detects that load 510 is connected to output terminal 104 through an AC or DC coupling 504. Otherwise, controller 502 determines that no load is connected output terminal 104. In this latter case, controller 502 may control current source 106 and current sink 116 to periodically test for load 510.

While current source 106 and current sink 116 are depicted as transistors 506 and 512 and resistors 508 and 514, in other embodiments, other circuit components configurable to controllably sink/source current may be used. Further, in some instances, load detection logic 520 can include a comparator. In an example, controller 502 can be implemented as firmware executable by a processor, such as a digital signal processor or a micro control unit (MCU). In another example, controller 502 can be implemented as a logic circuit configurable to detect the load. Further, though circuit 700 is described as including resistor 702 for detecting the driver current, in an alternative embodiment, controller 502 may monitor the control terminals or gates of metal oxide semiconductor field effect transistors (MOSFETs) of the driver circuit 102 to sense the current. In this alternative embodiment, controller still uses driver current detector 704 is a current sense circuit configured to monitor the gates of MOSFETs of the driver circuit 102.

In conjunction with the circuits and methods described above with respect to FIGS. 1-7, a circuit includes a controller configured to control a driver circuit, a current sink, and a current source, each of which is connected to an output terminal. The controller selectively disables the driver circuit and selectively enables the current source and measures a first voltage on the output terminal. The controller then disables the current source and enables a current sink, measuring a second voltage on the output terminal. The controller detects a load connected to the output terminal when the first and second voltages are substantially the same, and determines that no load is connected to the output terminal when the first and second voltages differ. The controller enables a driver circuit connected to the output terminal in response to detecting the load.

In a particular instance, the controller detects whether the load is AC connected or DC connected based on the first and second voltages. If the first and second voltages are the same and greater than zero volts, the load is AC connected. If the first and second voltages are the same and approximately zero volts, the load is DC connected. In a particular instance, the controller may enable the driver circuit and adjust one or more parameters of the driver circuit based on the type of connection. For example, the controller may control the driver circuit to utilize a different protocol or different frequency for an AC-coupled load than for a DC-coupled load.

Although the present invention has been described with reference to preferred embodiments, workers skilled in the art will recognize that changes may be made in form and detail without departing from the scope of the invention.

What is claimed is:

1. A circuit for detecting a load, the circuit comprising:
an output terminal;
a selectively enabled current source including a first terminal coupled to a first power supply terminal, a second terminal coupled to the output terminal, and a control terminal;
a selectively enabled current sink including a first terminal coupled to the output terminal, a second terminal coupled to a second power supply terminal, and a control terminal; and
a controller for detecting a load of unknown type during a load detection period, the controller including a first output coupled to the control terminal of the selectively enabled current source, a second output coupled to the control terminal of the selectively enabled current sink, and a measurement terminal coupled to the output terminal, the controller configured to enable the selectively enabled current source and disable the selectively enabled current sink during a first phase of the load detection period, the controller to disable the selectively enabled current source and enable the selectively enabled current sink during a second phase of the load detection period, the controller to activate a load detection signal to indicate a presence of the load coupled to the output terminal if a voltage at the measurement terminal during the first phase is substantially equal to a voltage at the measurement terminal during the second phase.

2. The circuit of claim 1, wherein the controller includes a second output terminal adapted to couple to a driver circuit coupled to the output terminal to provide the load detection signal thereto.

3. The circuit of claim 2, wherein the controller keeps the load detection signal inactive after the load detection period if the voltages at the measurement terminals during the first and second phases are not substantially equal.

4. The circuit of claim 2, further comprising:
a current detector including an input coupled to the driver circuit and including a detector output, the current detector configured to detect a current associated with the driver circuit and to provide a signal to the detector output that is related to the current; and
wherein the controller includes a current measurement input coupled to the detector output, the controller configured to disable the driver when the current falls below a threshold current level.

5. The circuit of claim 1, wherein the voltage at the measurement terminal during the first phase is approximately equal to a supply voltage and the voltage at the measurement terminal during the second phase is approximately equal to ground when no load is coupled to the output terminal.

6. The circuit of claim 1, wherein the controller comprises:
a current controller coupled to the control terminals of the selectively enabled current source and the selectively enabled current sink;
a measurement circuit coupled to the output terminal; and
a load detection logic circuit coupled to the measurement circuit and configured to activate the load detection signal in response to detecting a presence of the load.

7. An integrated circuit comprising:
an output terminal; and
a controller including a measurement input coupled to the output terminal, a first output adapted to couple to a current source to control a first current sourced into the output terminal, and a second output adapted to couple to a current sink to control a second current from the output terminal, the controller to apply control signals to the first output and the second output to selectively enable the current source and disable the current sink during a first phase of a load detection period and to disable the current source and enable the current sink during a second phase of the load detection period, the controller to activate a load detection signal to indicate a presence of the load coupled to the output terminal if a voltage at the measurement input during the first phase is substantially equal to a voltage at the measurement input during the second phase.

8. The integrated circuit of claim 7, further comprising the current source, which comprises:
a transistor including a first current electrode coupled to a first power supply terminal, a control terminal coupled to the first output of the controller, and a second current electrode; and
a resistor including a first terminal coupled to the second current electrode and a second terminal coupled to the output terminal.

9. The integrated circuit of claim 7, further comprising the current sink, which comprises:
a transistor including a first current electrode coupled to the output terminal, a control terminal coupled to the second output of the controller, and a second current electrode; and
a resistor including a first terminal coupled to the second current electrode and a second terminal coupled to a second power supply terminal.

10. The integrated circuit of claim 7, further comprising a driver circuit including an output coupled to the output terminal; and
wherein the controller further comprises a control output coupled to the driver circuit, the controller configured to generate a disable signal and to provide the disable signal to the control output to disable the driver circuit when the voltages during the first and second phases are not substantially equal.

11. The integrated circuit of claim 10, wherein, after the load detection period, the controller provides an enable signal to the control output when the voltages during the first and second phases are substantially equal, the enable signal to enable the driver circuit.

12. The integrated circuit of claim 10, further comprising:
a current detector coupled to the driver circuit and configured to detect a current flowing to the output terminal; and
wherein the controller includes a second measurement input coupled to the current detector, the controller to determine that the load is not coupled to the output terminal when the current falls below a threshold current level, the controller configured to generate the disable signal in response to determining that the load is not coupled to the output terminal.

13. The integrated circuit of claim 7, wherein the controller determines a type of a connection associated with the load based on a voltage level associated with the voltages during the first and second phases.

14. The integrated circuit of claim 13, wherein the controller determines that:
   the load is an AC-coupled load when the voltages are greater than zero volts during the first and second phases; and
   the load is a DC-coupled load when the voltages are approximately zero volts during the first and second phases.

15. An integrated circuit comprising:
   an output terminal;
   a current source having an output coupled to the output terminal when enabled;
   a current sink having an output coupled to the output terminal when enabled; and
   a controller coupled to the current source and the current sink, the controller to enable the current source and measure a first voltage on the output terminal during a first load detection phase and to enable the current sink and measure a second voltage on the output terminal during a second load detection phase, the controller to activate a load detection signal to indicate a presence of a load coupled to the output terminal when the first and second voltages are substantially equal.

16. The integrated circuit of claim 15, further comprising:
   a driver having an output coupled to the output terminal for providing an output signal to the output terminal in response to an input signal, when enabled; and
   wherein the controller disables the driver during the first and second load detection phases.

17. The integrated circuit of claim 16, wherein, after the second load detection phase, the controller enables the driver in response to detecting the load.

18. The integrated circuit of claim 16, wherein, after the second load detection phase, the controller returns to the first load detection phase if the first and second voltages are not substantially equal.

19. The integrated circuit of claim 16, further comprising:
   a current sense circuit coupled to the driver and configured to detect a current flowing to the output terminal; and
   wherein the controller disables the driver when the current falls below a threshold current level.

20. The integrated circuit of claim 15, wherein:
   the current source comprises a first current electrode coupled to a power supply terminal, a control electrode coupled to the controller, and a second current electrode coupled to the output terminal; and
   the current sink comprises a first current electrode coupled to the output terminal, a control electrode coupled to the controller, and a second current electrode coupled to a second power supply terminal.

\* \* \* \* \*